US011251691B2

(12) United States Patent
Hegde et al.

(10) Patent No.: US 11,251,691 B2
(45) Date of Patent: Feb. 15, 2022

(54) FLOATING POWER SUPPLY FOR A DRIVER CIRCUIT CONFIGURED TO DRIVE A HIGH-SIDE SWITCHING TRANSISTOR

(71) Applicant: STMicroelectronics Asia Pacific Pte Ltd, Singapore (SG)

(72) Inventors: Supriya Raveendra Hegde, Singapore (SG); Yannick Guedon, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 0 days.

(21) Appl. No.: 17/011,439

(22) Filed: Sep. 3, 2020

(65) Prior Publication Data

US 2021/0091655 A1 Mar. 25, 2021

Related U.S. Application Data

(60) Provisional application No. 62/904,038, filed on Sep. 23, 2019.

(51) Int. Cl.
*H02M 7/217* (2006.01)
*H03K 19/017* (2006.01)
*H02M 1/08* (2006.01)
*H02M 1/32* (2007.01)

(52) U.S. Cl.
CPC .............. *H02M 1/08* (2013.01); *H02M 1/32* (2013.01); *H02M 7/217* (2013.01); *H03K 19/01714* (2013.01); *H03K 19/01735* (2013.01)

(58) Field of Classification Search
CPC ............ H02M 7/217; H03K 19/01714; H03K 19/01735
USPC ........................... 323/289; 327/589; 363/127
See application file for complete search history.

(56) References Cited

U.S. PATENT DOCUMENTS

| | | | | |
|---|---|---|---|---|
| 7,046,040 | B2* | 5/2006 | Guedon | H03F 3/217 |
| | | | | 326/88 |
| 8,558,584 | B2* | 10/2013 | Draxelmayr | H03K 5/1515 |
| | | | | 327/108 |
| 8,558,586 | B1* | 10/2013 | Martin | H03K 17/6871 |
| | | | | 327/108 |
| 2005/0102128 | A1* | 5/2005 | Wilhelm | H03K 17/063 |
| | | | | 703/23 |
| 2017/0054369 | A1* | 2/2017 | Chin | H02M 3/1588 |
| 2017/0126113 | A1* | 5/2017 | Ejury | H02M 1/08 |
| 2017/0141775 | A1* | 5/2017 | Caggegi | H03K 17/04123 |
| 2017/0324411 | A1* | 11/2017 | Gong | H03K 19/01735 |

* cited by examiner

*Primary Examiner* — Gary A Nash
(74) *Attorney, Agent, or Firm* — Crowe & Dunlevy

(57) ABSTRACT

A high-side switching transistor of a rectifier circuit is driven by a high-side driver circuit to supply current to an output node. The high-side driver circuit is powered between a capacitive bootstrap node and the output node. A boot charge circuit charges the bootstrap capacitor by supplying current to the bootstrap node. The boot charge circuit includes: a first current path that selectively supplies a first charging current to the bootstrap node when the rectifier circuit is operating in a switching mode; and a second current path that selectively supplies a second charging current to the bootstrap node when the rectifier circuit is operating in a reset mode.

18 Claims, 7 Drawing Sheets

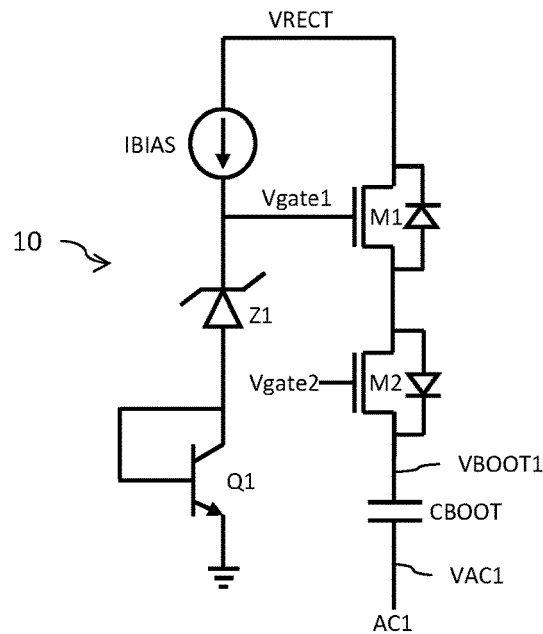
FIG. 1
(Prior Art)
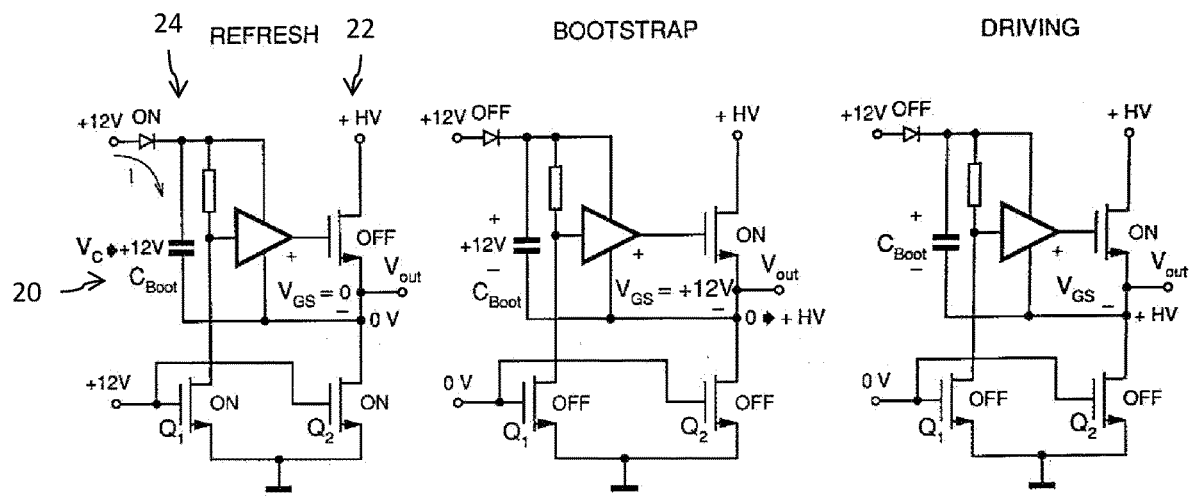
FIG. 2A
(Prior Art)
FIG. 2B
(Prior Art)
FIG. 2C
(Prior Art)

FLOATING POWER SUPPLY FOR A DRIVER CIRCUIT CONFIGURED TO DRIVE A HIGH-SIDE SWITCHING TRANSISTOR

CROSS REFERENCE TO RELATED APPLICATIONS

This application claims priority from United States Provisional Application for Patent No. 62/904,038 filed Sep. 23, 2019, the disclosure of which is incorporated by reference.

TECHNICAL FIELD

The present invention generally relates to a power supply circuit and, in particular, to a bootstrapped power supply for use in a transistor driver circuit.

BACKGROUND

Rectifiers, inverters and buck/boost/buck-boost converters are widely used circuits in AC-DC and DC-AC conversion. It is common for such circuits to have low-side transistor switches and high-side transistor switches that turn on and off based on some control signals. Low-side switches are commonly realized with n-channel metal oxide semiconductor (NMOS) field effect transistors (FETs), and these switches are easy to control as they are typically referenced to system ground. High-side switches are also commonly realized with NMOS FETs for area saving reasons. However, NMOS high-side switches are not referenced to the ground and are thus are more complex to control. Typically, the high-side switches are driven using a bootstrap technique whereby a bootstrap capacitor (CBOOT) is recharged when the low side transistor is conducting, and the energy stored in the capacitor is used to control the gate-to-source voltage (Vgs) of the high-side NMOS transistor switch when the output is flying high. There is a need for a robust and accurately charged bootstrap capacitor in order to provide a stable power supply to the drivers of high-side transistor switch.

Reference is now made to FIG. 1 which shows a schematic of a prior art circuit 10 for charging a bootstrap capacitor CBOOT. The diode-connected bipolar transistor Q1 and zener diode Z1 (connected in series) respond to a bias current MIAS to create a reference voltage at node Vgate1 and the bootstrap capacitor CBOOT is charged, through transistors M1 and M2 in response to a control signal at node Vgate2, to the zener voltage when the voltage at node AC1 is zero. When the voltage at node AC1 subsequently rises, the voltage VBOOT is bootstrapped to a higher value.

The main challenges with the circuit of FIG. 1 are variation of the generated boosted supply voltage VBOOT1-VAC1 across process corner, temperature and variation in the input rectified voltage VRECT. The reference voltage Vgate1 generated from the zener diode Z1 is also dependent on the bias current IBAIS. The boosted supply voltage VBOOT1-VAC1 will always be lower than the rectified voltage VRECT when VREC is less than 6V. So, it is clear that the circuit 10 needs a higher rectified voltage VRECT to start the charging. The boosted supply voltage VBOOT1-VAC1 also depends on the mode of the rectifier which is generating the input rectified voltage VRECT since the emitter of transistor Q1 is always at zero volts (ground), but the voltage VAC1 can be −0.7V or 0V depending on rectifier operation in diode mode or synchronous mode. Because the boosted supply voltage VBOOT1-VAC1 is the power supply for the high-side switch driver circuit, this voltage will be different than the supply for the low-side switch driver circuit and as a result there will be non-symmetrical on-resistance (Rds_on) for the high-side and low-side transistor switches.

FIGS. 2A-2C show a prior art circuit 20 including a half-bridge circuit 22 and a driver circuit 24 with bootstrap. FIG. 2A illustrates operation of the circuit 20 in refresh mode, FIG. 2B illustrates operation of the circuit 20 in bootstrap mode, and FIG. 2C illustrates operation of the circuit 20 in driving mode. This circuit solution shows some limitations when the technology node moves higher and the driving voltage moves lower. One challenge is to make sure that the diode thresholds compensate. There is especially a concern when an external capacitor is used for the bootstrap capacitor CBoot. In that case there will be a chip pin where the boosted voltage VBOOT is generated. With a pin for the regulated input voltage VREG and a pin for the boosted voltage VBOOT, proper electrostatic discharge (ESD) protection is needed, and thus the size of the diode must be controlled to address ESD. If the bootstrap capacitor CBoot is over-charged, this may result in some cases in a driving voltage for the high-side transistor which exceeds the safe operating area (SOA) of the process (i.e., when the maximum allowable Vgs is as low as 2.5V for advanced nodes).

There is accordingly a need in the art for addressing the deficiencies of the prior art circuits. In particular, there is a need for making sure that the charging voltage of the bootstrap capacitor is well-controller over the full range of circuit operation.

SUMMARY

In an embodiment, a circuit comprises: a rectifier circuit including: a high-side switching transistor configured to supply current to an output node; and a high-side driver circuit configured to drive a control terminal of the high-side switching transistor, wherein the high-side driver circuit is powered between a bootstrap node and the output node; wherein the rectifier circuit is operable in a switching mode and in a reset mode. The circuit further comprises a bootstrap capacitor coupled between the bootstrap node and the output node; and a boot charge circuit configured to charge the bootstrap capacitor by supplying current to the bootstrap node. The boot charge circuit comprises: a first current path configured to selectively supply a first charging current to the bootstrap node, said first current path actuated in response to rectifier circuit operation in the switching mode; and a second current path configured to selectively supply a second charging current to the bootstrap node, said second current path actuated in response to rectifier circuit operation in the reset mode.

In an embodiment, a circuit comprises: a high-side switching transistor coupled between a first node and a second node; a high-side driver circuit configured to drive a control terminal of the high-side switching transistor, wherein the high-side driver circuit is powered between a bootstrap node and the first node. The circuit further includes a bootstrap capacitor coupled between the bootstrap node and the input node and a boot charge circuit configured to charge the bootstrap capacitor by supplying current to the bootstrap node. The boot charge circuit comprises: a first current path configured to selectively supply a first charging current to the bootstrap node, said first current path actuated when the high-side switching transistor is driven by the high-side driver circuit in a switching mode of operation; and a second current path configured to selectively supply a second charging current to the bootstrap node, said second current path actuated when the high-side switching transistor is driven by the high-side driver circuit in a reset mode of operation.

BRIEF DESCRIPTION OF THE DRAWINGS

For a better understanding of the embodiments, reference will now be made by way of example only to the accompanying figures in which:

FIG. 1 is a schematic of a prior art circuit for charging a bootstrap capacitor;

FIGS. 2A-2C show a prior art circuit including a half-bridge circuit and a driver circuit with bootstrap;

DETAILED DESCRIPTION

Figure 3:
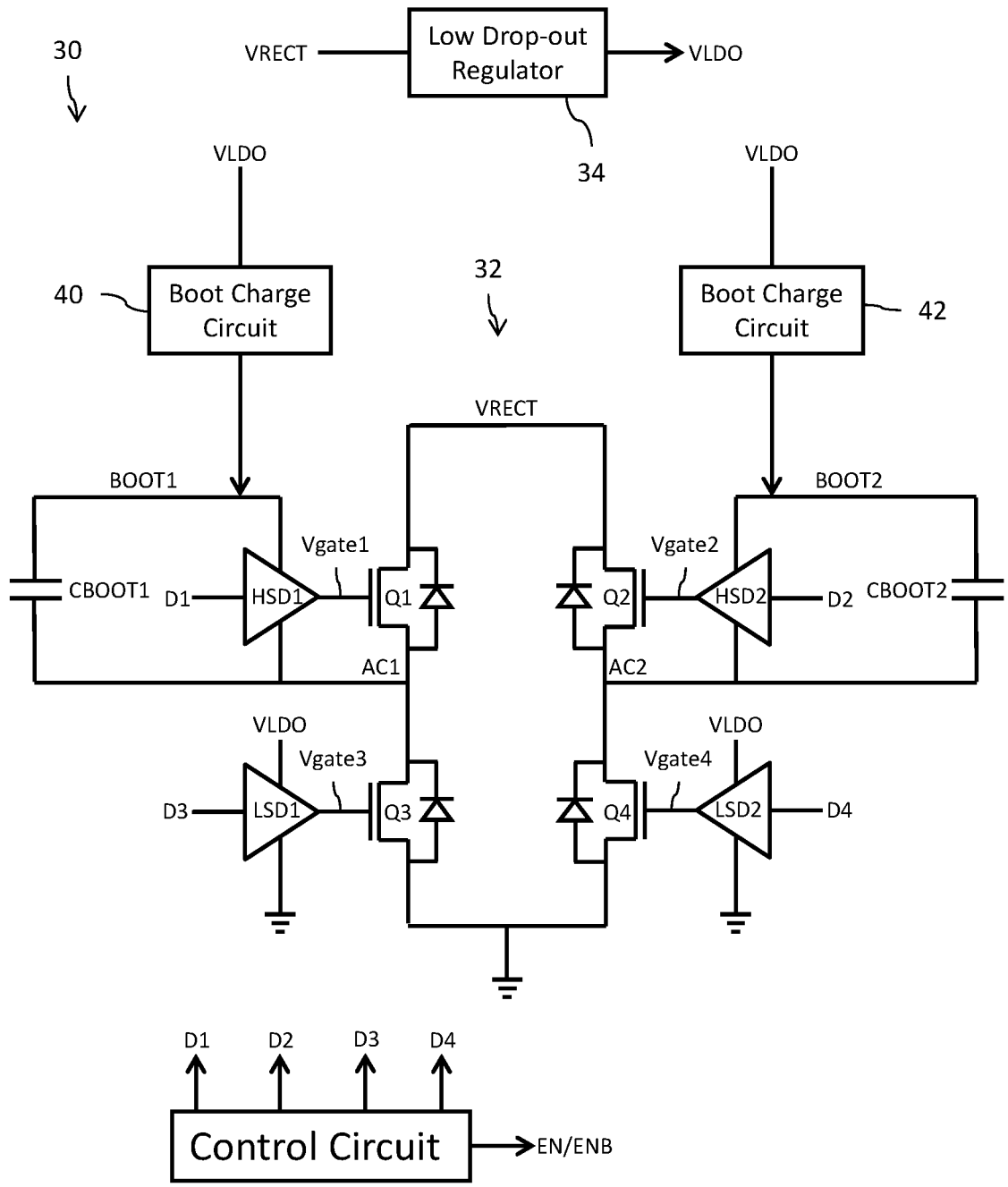
FIG. 3 shows a circuit diagram for a bridge circuit with bootstrap high-side drive.

Reference is now made to FIG. 3 which shows a circuit diagram for a rectifier circuit 30 including a rectifying bridge circuit 32 with bootstrap high-side drive. A rectified voltage VRECT is generated from an A/C input. A low drop-out regulator circuit 34 receives the rectified voltage VRECT and generates a regulated low drop-out voltage VLDO. The bridge circuit 32 is of a full-bridge type including a first half-bridge formed by high-side switching transistor Q1 and low-side switching transistor Q3 series connected at A/C input node AC1 between the rectified voltage VRECT node and the reference/ground node, and a second half-bridge formed by high-side switching transistor Q2 and low-side switching transistor Q4 series connected at A/C input node AC2 between the rectified voltage VRECT node and the reference/ground node. The gate of high-side switching transistor Q1 is driven (with drive voltage Vgate1) by a high-side driver circuit HSD1 in response to a control signal D1 generated by a rectification control circuit. The gate of high-side switching transistor Q2 is driven (with drive voltage Vgate2) by a high-side driver circuit HSD2 in response to a control signal D2 generated by the rectification control circuit. The gate of low-side switching transistor Q3 is driven (with drive voltage Vgate3) by a low-side driver circuit LSD1 in response to a control signal D3 generated by the rectification control circuit. The gate of low-side switching transistor Q4 is driven (with drive voltage Vgate4) by a low-side driver circuit LSD2 in response to a control signal D4 generated by the rectification control circuit. Power supply for the high-side driver circuit HSD1 is between bootstrap voltage node BOOT1 and the voltage at the first half-bridge A/C input node AC1. Power supply for the high-side driver circuit HSD2 is between bootstrap voltage node BOOT2 and the voltage at the second half-bridge A/C input node AC2. Power supply for the low-side driver circuits LSD1 and LSD2 is between low drop-out voltage VLDO and the reference/ground voltage. A first bootstrap capacitor CBOOT1 is connected between the bootstrap voltage node BOOT1 and the first half-bridge output node AC1. A second bootstrap capacitor CBOOT2 is connected between the bootstrap voltage node BOOT2 and the second half-bridge output node AC2.

Figure 4A:
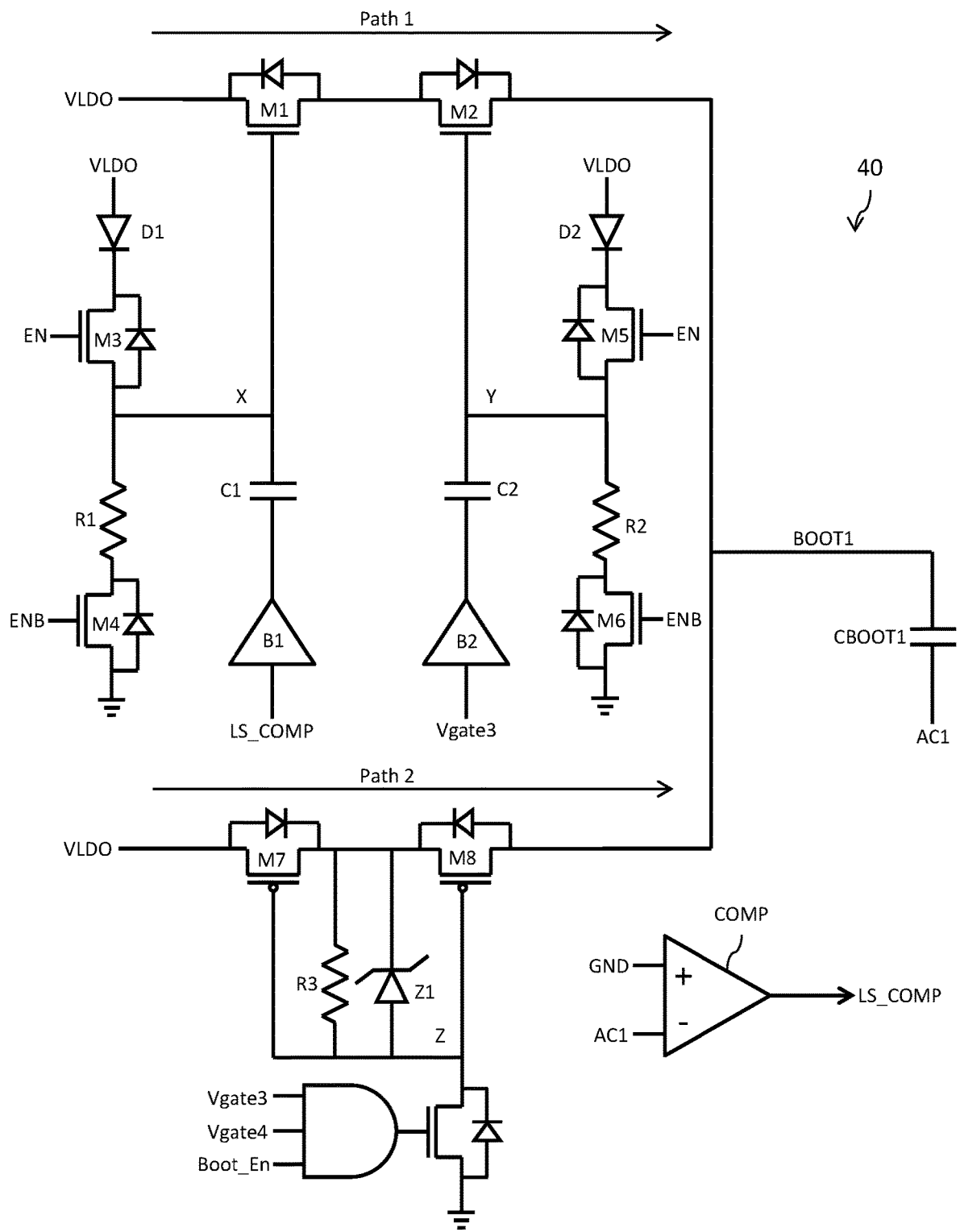
FIGS. 4A and 5A each show a circuit diagram of a boot charge circuit for use in the circuit of FIG. 3.
Figure 4B:
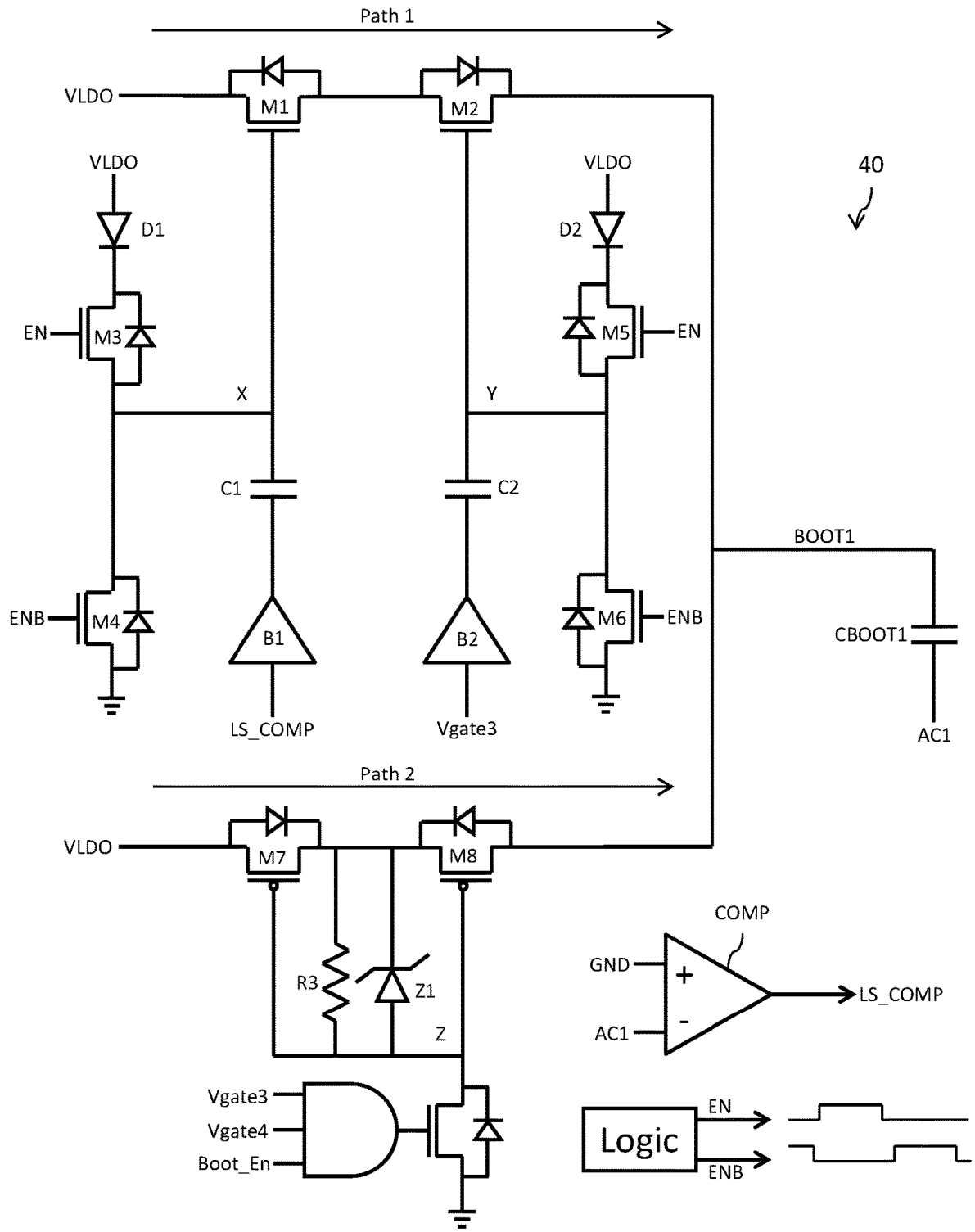
FIGS. 4B and 5B each show a circuit diagram of a boot charge circuit having an alternate configuration for use in the circuit of FIG. 3.
Figure 5A:
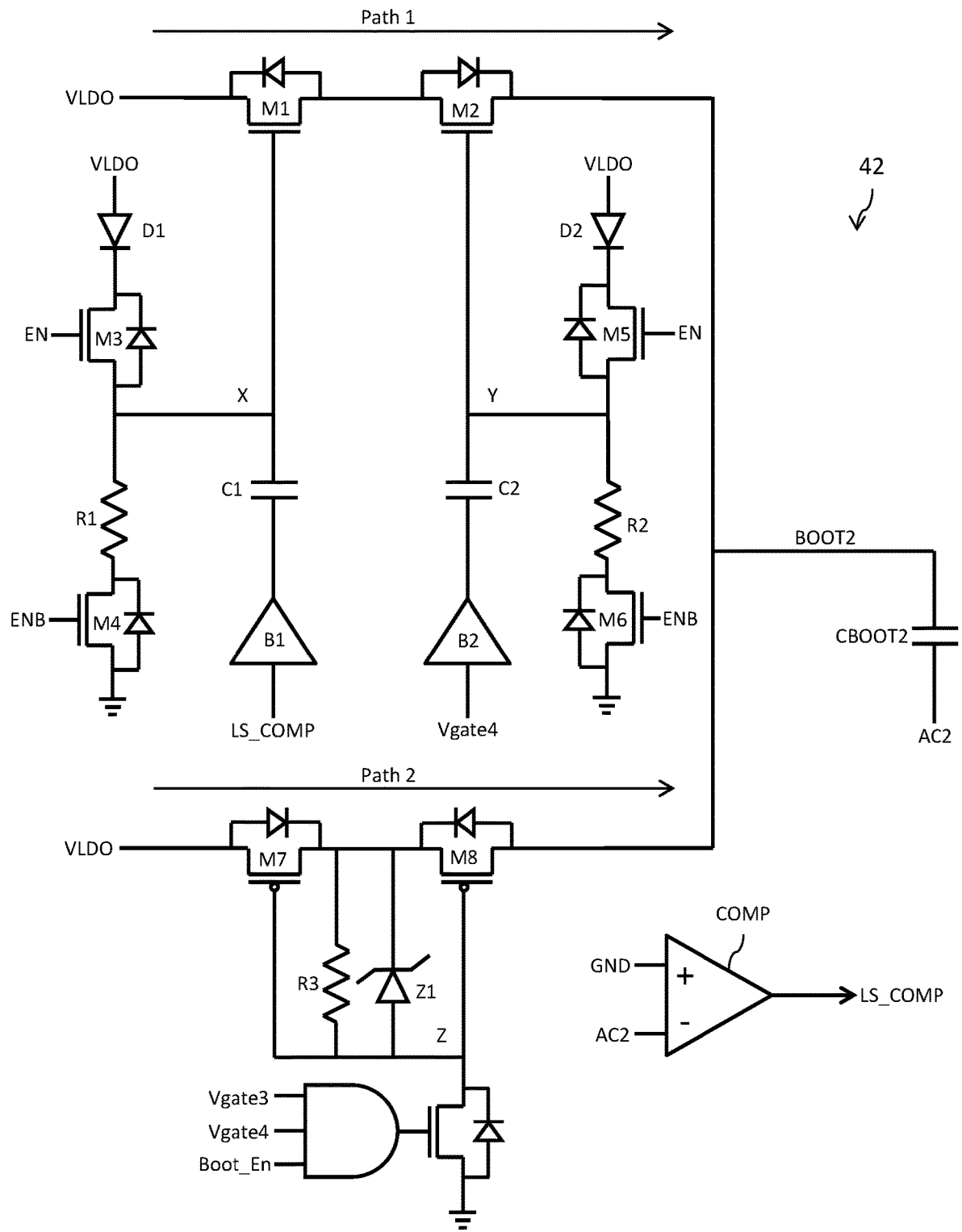
Figure 5B:
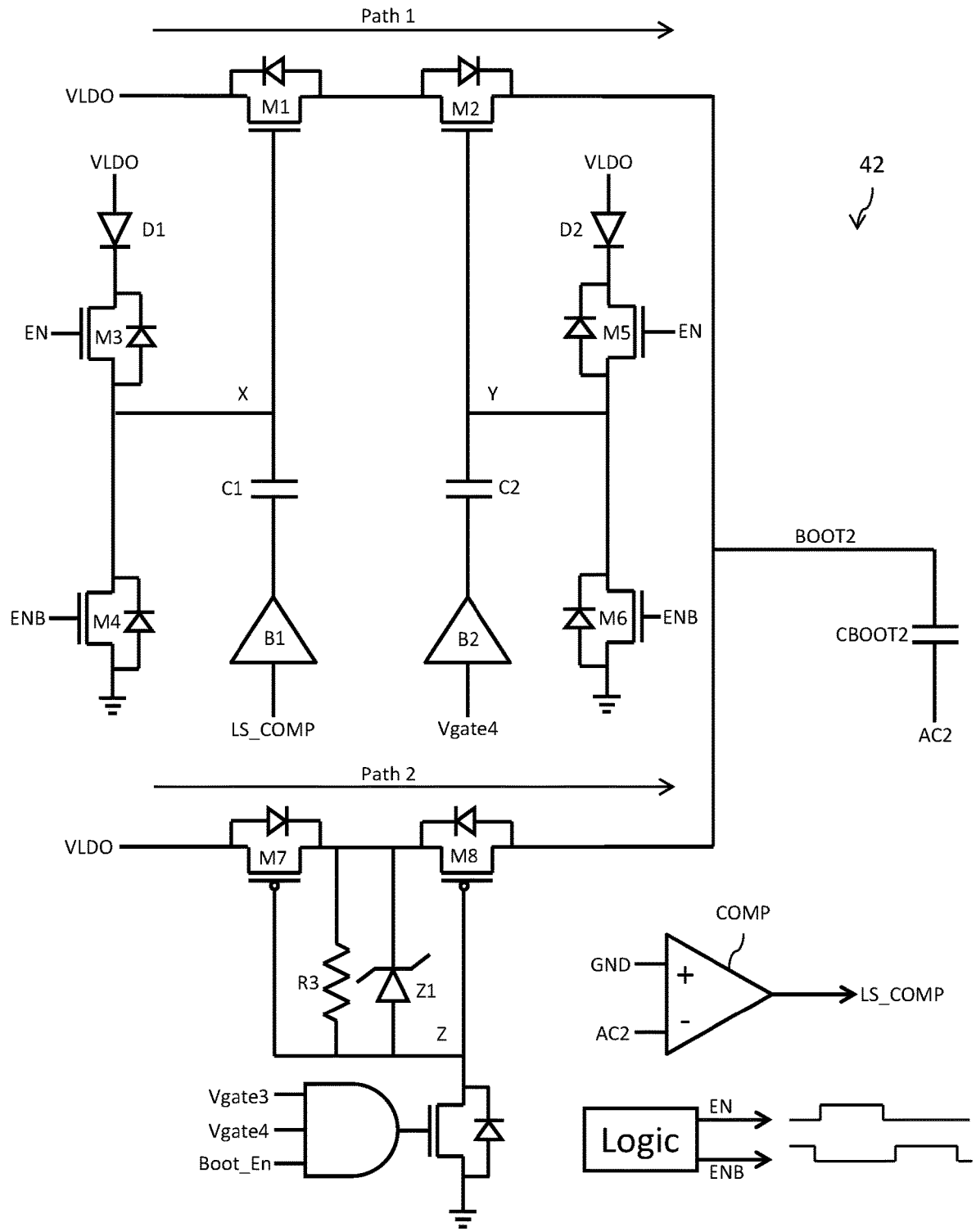

The charging voltage at bootstrap voltage node BOOT1 is generated from the low drop-out voltage VLDO by a first boot charge circuit 40, and the charging voltage at bootstrap voltage node BOOT2 is generated from the low drop-out voltage VLDO by a second boot charge circuit 42. The first and second boot charge circuits 40, 42 have a same circuit construction. FIGS. 4A-4B show embodiments for the first boot charge circuit 40, and FIGS. 5A-5B shows embodiments for the second boot charge circuit 42.

Reference is now made to FIG. 4A for a description of the circuit 40 and its connections. For sake of brevity, the circuit 42 as shown in FIG. 5A will not be specifically described, it being understood that the operation is generally the same as the circuit 40 but with different circuit connections in FIG. 3. The boot charge circuit 40 has two current paths (Path 1 and Path 2) to charge the bootstrap capacitor CBOOT1 which is connected between the bootstrap node BOOT1 and the first half-bridge voltage node AC1.

Path 1 is defined by series n-channel connected transistors M1 and M2 whose sources are tied together and whose drains are connected to the low drop-out voltage VLDO and the bootstrap node BOOT1, respectively. The gate of transistor M1 is driven by the signal at node X, and the gate of transistor M2 is driven by the signal at node Y. A first buffer B1 has an input receiving the LS_COMP signal output from a comparator COMP which functions to compare the reference/ground voltage (received at the non-inverting input) to the voltage at the first A/C input node AC1 (received at the inverting input). The output of buffer B1 is connected to a first plate of a capacitor C1, with the second plate of the capacitor C1 connected to node X. A second buffer B2 has an input receiving the voltage Vgate3 at the gate of low-side transistor Q3 in the first half-bridge. The output of buffer B2 is connected to a first plate of a capacitor C2, with the second plate of the capacitor C2 connected to node Y. A first diode D1 is connected in series with an NMOS transistor M3 between the low drop-out voltage VLDO and node X. The gate of transistor M3 is driven by an enable signal EN generated by the rectification control circuit. A second diode D2 is connected in series with an NMOS transistor M5 between the low drop-out voltage VLDO and node Y. The gate of transistor M5 is driven by the enable signal EN. A first resistor R1 is connected in series with an NMOS transistor M4 between node X and the reference/ground voltage. The gate of transistor M4 is driven by a delayed and logically inverted version of the enable signal EN referred to as ENB generated by the rectification control circuit. A second resistor R2 is connected in series with an NMOS transistor M6 between node Y and the reference/ground voltage. The gate of transistor M6 is driven by the delayed and logically inverted enable signal ENB.

Path 1 has the following operation during normal rectifier/inverter operation (such as: when drive signals Vgate1 and Vgate3 and when drive signals Vgate2 and Vgate4 alternate under the control of the rectification control circuit, with Vgate1 and Vgate2 never being simultaneously in the same state and with Vgate3 and Vgate4 never being simultaneously in the same state). The low drop-out voltage VLDO is stored across capacitor C1 and capacitor C2 in response to current flow through diode D1/transistor M3 (enabled by signal EN) and diode D1/transistor M5 (enabled by signal EN). This operation occurs during the time period when the low-side transistor Q3 in the first half-bridge is turned off and transistor Q1 is turned on. In response to assertion of the voltage Vgate3 at the gate of low-side transistor Q3 in the first half-bridge (i.e., logic 1), transistor Q3 turns on (and transistor Q1 is off) and the voltage at the output node AC1 falls. The comparator COMP senses when that AC1 voltage falls below the reference/ground voltage, and in response thereto asserts the LS_COMP signal to logic 1. At this point in time, both the voltage Vgate3 and the LS_COMP signal are logic 1. The voltages at the nodes X and Y are then each bootstrapped by the stored low drop-out voltage VLDO across capacitor C1 and capacitor C2 in order to ensure that transistors M1 and M2 are both fully turned on. The activated transistors M1 and M2 of Path 1 pass a current to charge the bootstrap capacitor CBOOT1 to the level of the low drop-out voltage VLDO. The comparator COMP then senses when the AC1 voltage rises above the reference/ground voltage as the direction of the current has flipped. In response thereto, the LS_COMP signal is asserted to logic 0. At this point in time, both the voltage Vgate3 and the LS_COMP signals are transitioned from 1 to 0. The voltages at the nodes X and Y are then each bootstrapped down by the stored low drop-out voltage VLDO across capacitor C1 and capacitor C2 in order to ensure that transistors M1 and M2 are both fully turned off. The transistors M1 and M2 of Path 1 are turned off and completely remove the path from VLDO to VBOOT1.

The rectification control circuit generates the EN signal at logic 0 at times when the VLDO voltage output from the low drop-out regulator 24 is not ready. The nodes X and Y are fully discharged to ground. Once the VLDO voltage output is ready, the EN signal changes state from logic 0 to logic 1, enabling operation of the circuit 40 or 42, in order to ensure that signals X and Y can be charged to VLDO-Vth (M3 or M5). Diode D1 and D2 protect the node X and Y from leaking the current to VLDO and discharge, when they are bootstrapped up during the operation.

Path 2 is defined by series connected p-channel transistors M7 and M8 whose sources are tied together and whose drains are connected to the low drop-out voltage VLDO and the bootstrap node BOOT1. The gates of transistors M7 and M8 are both driven by the signal at node Z. A resistor R3 is connected between node Z and the common sources of transistors M7 and M8. A zener diode Z1 is connected between node Z (at the zener anode) and the common sources of transistors M7 and M8 (at the zener cathode). An NMOS transistor M9 has its drain connected to node Z and its source connected to the reference/ground voltage. The gate of transistor M9 is driven by a logic signal output by a logic circuit (in this case, a three input AND gate) which logically combines the voltage Vgate3 at the gate of low-side transistor Q3 in the first half-bridge, the voltage Vgate4 at the gate of low-side transistor Q4 in the second half-bridge and a boot charge enable signal (Boot EN).

Path 2 has the following operation during rectifier/inverter reset operation. During reset of the rectifier, transistors Q3 and Q4 are both turned on by the voltages Vgate3 and Vgate4, respectively, generated in response to the rectification control circuit (and the transistors Q1 and Q2 are both off). In this reset mode of operation, there is no switching being performed. In response to assertion logic high of the boot charge enable signal Boot EN, with both Vgate3 and Vgate4 also logic high, the AND gate asserts its output signal logic high and turns on transistor M9. This pulls node Z to the reference/ground voltage which is then applied to the gates of p-channel transistors M7 and M8. Transistors M7 and M8 both turn on. The activated transistors M7 and M8 of Path 2 pass a current to charge the bootstrap capacitor CBOOT1 to the level of the low drop-out voltage VLDO. When the rectifier is released from the reset state, and operation in the normal switching mode resumes with switching controlled by the signals generated by the rectifier control circuit, transistors Q3 and Q4 will never both be turned on at the same time, and the output of the AND gate is driven to logic low causing p-channel transistors M7 and M8 to both turn off so as to block Path 2. The voltage at node Z in this condition will follow the voltage at the bootstrap node BOOT1.

It will be noted that Path 1 has to be designed with transistors M1 and M2 to recharge the bootstrap capacitor CBOOT within twice the maximum frequency of the rectifier/inverter switching operation. The size of the transistors depends on the Ron required for the settling based on maximum load on the bootstrap node BOOT1. The diode drop on Path 1 during diode operating mode has to be more than the rectifier diode drop in order to have the voltage difference between the voltage at the bootstrap node BOOT1 and the voltage at the output node AC1 voltage always less than or equal to the low drop-out voltage VLDO.

In an embodiment, Path 1 may only include transistor M2 (i.e., transistor M1 is missing or bypassed). This circuit solution works as well as the solution with both M1 and M2 in normal operation. However, the size of the transistor M2 has to be in line with the ESD requirements since there exists a path through the parasitic diode of transistor M2 from the external pad for the bootstrap node BOOT1 (supporting connection to an external bootstrap capacitor CBOOT1) to the external pad for the low drop-out voltage VLDO. The inclusion of back-to-back transistor switches M1 and M2 helps to give the circuit designer a flexibility to decide on the size of the transistor switch based on the foregoing recharge and diode drop requirements without the trouble of having an ESD constraint to design. Indeed, with the preferred circuit solution there is no direct ESD path from VLDO to BOOT1, and therefore ESD protection can use another scheme. As an example, the pad for VLDO can be protected on its own (with a local ESD clamp, for example) and the pad for BOOT1 can be protected on its own (with a proper diode to ESD floating rail or HV ESD clamp, for example).

It will further be noted that Path 2 has to be designed with transistors M7 and M8 based on the reset time available to charge the bootstrap capacitor CBOOT1. Many of the practical cases have a reset time that is significantly relaxed, which will allow the designer to choose a relatively lower size device for transistors M7 and M8.

In the alternate circuit embodiment of FIGS. 4B and 5B, the resistor R1 is omitted with the transistor M4 directly connected to node X, and the resistor R2 is omitted with the transistor M5 directly connected to node Y. The advantage of this circuit configuration in comparison to the circuit configuration of FIGS. 4A and 5A is that the circuit occupies a smaller integrated circuit area due to the omission of the resistors R1 and R2 which can take up a not insignificant amount of area on the die. The removal of the resistors R1 and R2, however, introduces a concern with leakage current through M3-M4 (and M5-M6) during logic transition of the signals EN and ENB. To address this, a logic circuit is provided to generate the signals EN and ENB in a non-overlapping manner as shown.

Figure 6:
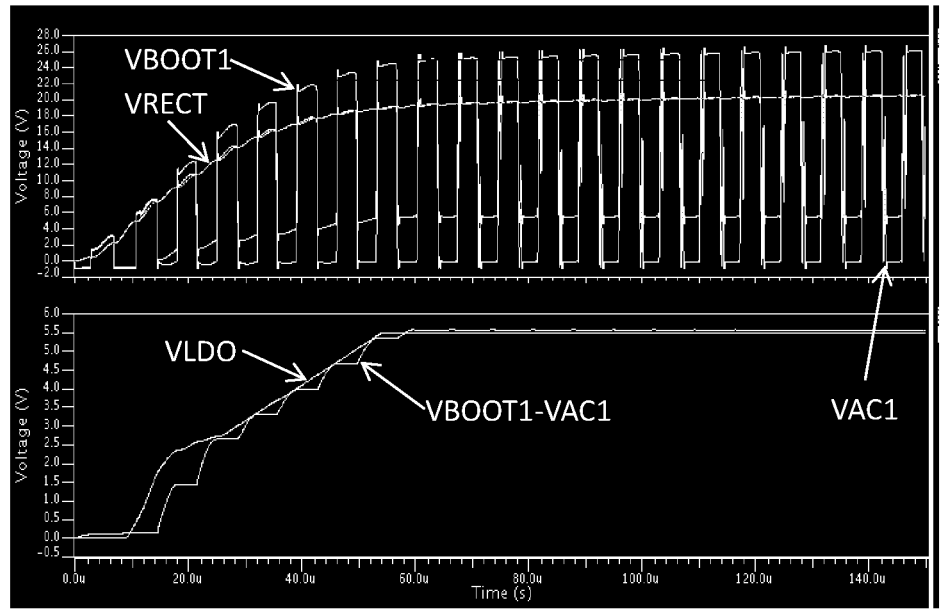
FIGS. 6-7 show operational waveforms for the circuit.
Figure 7:
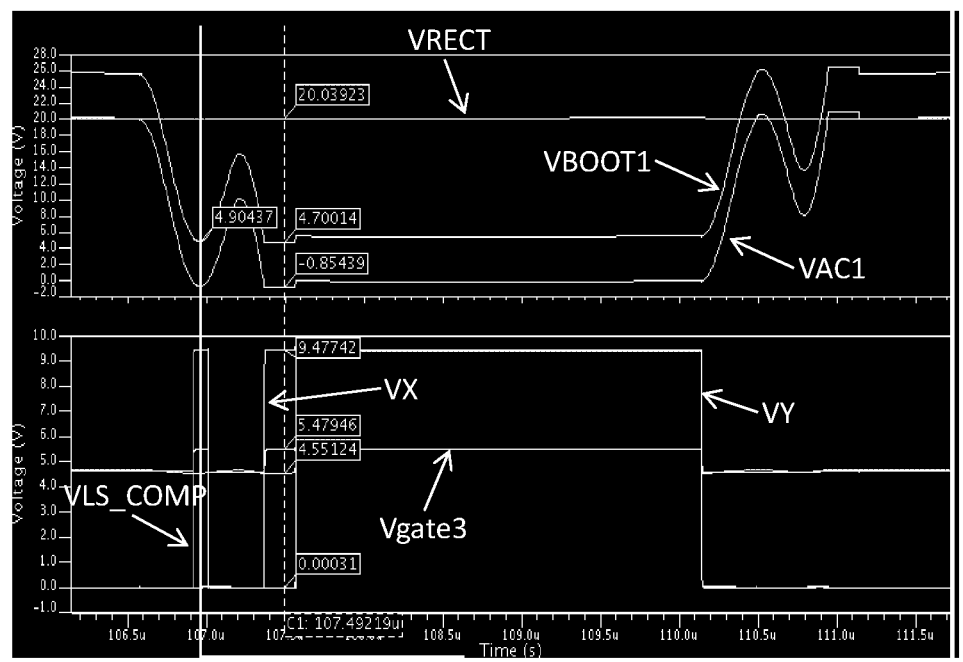

Reference is now made to FIGS. 6-7 which show operational waveforms for the circuit. The voltages VX and VY at the X and Y nodes are bootstrapped according to the comparator output and gate input signal. Even if the rectifier goes into diode mode, the voltage difference between nodes BOOT1 and AC1 always stays at the VLDO voltage or lower which is below the SOA threshold.

The circuit presents a number of advantages including: a) variations on the power supply for the high-side drivers is reduced; b) operation is supported even if the rectified voltage VRECT is reduced; and c) both the high-side and low-side switches see the same Vgs.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit, comprising:
    a rectifier circuit operable in a switching mode and in a reset mode, wherein the rectifier circuit includes:
        a high-side switching transistor coupled between an input node and an output node; and
        a high-side driver circuit configured to drive a control terminal of the high-side switching transistor, wherein the high-side driver circuit is powered between a bootstrap node and the input node;
    a bootstrap capacitor coupled between the bootstrap node and the input node;
    a boot charge circuit configured to charge the bootstrap capacitor by supplying current to the bootstrap node, wherein the boot charge circuit comprises:
        a first current path configured to selectively supply a first charging current to the bootstrap node, said first current path actuated in response to rectifier circuit operation in the switching mode; and
        a second current path configured to selectively supply a second charging current to the bootstrap node, said second current path actuated in response to rectifier circuit operation in the reset mode.

2. The circuit of claim 1, wherein the input node receives an AC signal and wherein the output node generates a DC signal.

3. The circuit of claim 1, wherein the rectifier circuit includes a low-side switching transistor series coupled at the input node to the high-side switching transistor, wherein the high-side and low-side switching transistors are coupled between the output node and a ground node, and wherein the high-side and low-side switching transistors are alternately actuated in the switching mode and wherein the high-side transistor is off and the low-side transistor is on in the reset mode.

4. The circuit of claim 1, wherein the output node generates a DC signal, the circuit further including a voltage regulator circuit powered by the DC signal and configured to generate a regulated voltage.

5. The circuit of claim 4, wherein the boot charge circuit is powered by the regulated voltage.

6. The circuit of claim 1, wherein the rectifier circuit includes a low-side switching transistor series coupled at the input node to the high-side switching transistor, and wherein the first current path comprises a first transistor and second transistor coupled in series with each other between the regulated voltage and the bootstrap node, the circuit further comprising:
    a first gate control circuit configured to generate a first gate signal applied to a gate of the first transistor, wherein the first gate signal is boosted in response to a comparison of a signal at the input node to a reference; and
    a second gate control circuit configured to generate a second gate signal applied to a gate of the first transistor, wherein the second gate signal is boosted in response to actuation of the low-side switching transistor.

7. The circuit of claim 6, wherein the signal at the input node is an A/C signal.

8. The circuit of claim 6, wherein the output node generates a DC signal, the circuit further including a voltage regulator circuit powered by the DC signal and configured to generate a regulated voltage, and wherein the first gate control circuit is enabled for operation in response to the generated regulated voltage.

9. The circuit of claim 6, wherein the output node generates a DC signal, the circuit further including a voltage regulator circuit powered by the DC signal and configured to generate a regulated voltage, and wherein the second gate control circuit is enabled for operation in response to the generated regulated voltage.

10. The circuit of claim 1, wherein the second current path comprises a first transistor and second transistor coupled in series with each other between the regulated voltage and the bootstrap node, the circuit further comprising:
    a gate control circuit configured to generate a gate signal applied to gates of the first and second transistors in response to rectifier circuit operation in the reset mode.

11. The circuit of claim 10, wherein the rectifier circuit includes a low-side switching transistor series coupled at the input node to the high-side switching transistor, and wherein the gate control circuit generates the gate signal in response to actuation of the low-side switching transistor during the reset mode.

12. A circuit, comprising:
    a high-side switching transistor coupled between a first node and a second node;
    a high-side driver circuit configured to drive a control terminal of the high-side switching transistor, wherein the high-side driver circuit is powered between a bootstrap node and the first node;
    a bootstrap capacitor coupled between the bootstrap node and the input node;
    a boot charge circuit configured to charge the bootstrap capacitor by supplying current to the bootstrap node, wherein the boot charge circuit comprises:
        a first current path configured to selectively supply a first charging current to the bootstrap node, said first current path actuated when the high-side switching transistor is driven by the high-side driver circuit in a switching mode of operation; and
        a second current path configured to selectively supply a second charging current to the bootstrap node, said second current path actuated when the high-side switching transistor is driven by the high-side driver circuit in a reset mode of operation.

13. The circuit of claim 12, further including a low-side switching transistor series coupled at the first node to the high-side switching transistor, and wherein the high-side and low-side switching transistors are alternately actuated in the switching mode of operation and wherein the high-side transistor is off and the low-side transistor is on in the reset mode.

14. The circuit of claim 13, wherein the first current path comprises a first transistor and second transistor coupled in series with each other between a regulated voltage and the bootstrap node, the circuit further comprising:
    a first gate control circuit configured to generate a first gate signal applied to a gate of the first transistor, wherein the first gate signal is boosted in response to a comparison of a signal at the first node to a reference; and a second gate control circuit configured to generate a second gate signal applied to a gate of the first transistor, wherein the second gate signal is boosted in response to actuation of the low-side switching transistor.

15. The circuit of claim 14, wherein the first gate control circuit is enabled for operation in response to the regulated voltage.

16. The circuit of claim 14, wherein the second gate control circuit is enabled for operation in response to the regulated voltage.

17. The circuit of claim 12, wherein the second current path comprises a first transistor and second transistor coupled in series with each other between the regulated voltage and the bootstrap node, the circuit further comprising:

a gate control circuit configured to generate a gate signal applied to gates of the first and second transistors in response to the reset mode of operation.

18. The circuit of claim 17, further including a low-side switching transistor series coupled at the input node to the high-side switching transistor, and wherein the gate control circuit generates the gate signal in response to actuation of the low-side switching transistor during the reset mode.

\* \* \* \* \*